United States Patent
Kuwabara et al.

(10) Patent No.: US 9,072,204 B2
(45) Date of Patent: Jun. 30, 2015

(54) ELECTRONIC MODULE AND PRODUCTION METHOD THEREFOR

(75) Inventors: Ryo Kuwabara, Osaka (JP); Atsushi Yamaguchi, Osaka (JP); Masahiro Ono, Osaka (JP); Hidenori Miyakawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 665 days.

(21) Appl. No.: 13/384,502

(22) PCT Filed: Jul. 15, 2010

(86) PCT No.: PCT/JP2010/004590
§ 371 (c)(1),
(2), (4) Date: Jan. 17, 2012

(87) PCT Pub. No.: WO2011/007570
PCT Pub. Date: Jan. 20, 2011

(65) Prior Publication Data
US 2012/0120613 A1    May 17, 2012

(30) Foreign Application Priority Data
Jul. 17, 2009    (JP) ................................ 2009-168625

(51) Int. Cl.
*H05K 3/28* (2006.01)
*H01L 21/56* (2006.01)
(Continued)

(52) U.S. Cl.
CPC .............. *H05K 3/284* (2013.01); *H01L 21/561* (2013.01); *H01L 21/565* (2013.01);
(Continued)

(58) Field of Classification Search
CPC . H01L 21/561; H01L 21/565; H01L 23/3121; H01L 23/552; H01L 25/165; H01L 2224/16225; H01L 2924/01019; H01L 2924/3025; H05K 3/284; H05K 1/0218; H05K 1/0313; H05K 2203/1316

USPC .......... 174/350–397, 520–565; 361/746, 728, 361/679.01, 600
See application file for complete search history.

(56) References Cited

U.S. PATENT DOCUMENTS

| | | | | |
|---|---|---|---|---|
| 7,569,925 B2 * | 8/2009 | Nishizawa et al. | ........... | 257/700 |
| 2005/0051358 A1 * | 3/2005 | Kawamoto et al. | ........... | 174/260 |

(Continued)

FOREIGN PATENT DOCUMENTS

| | | |
|---|---|---|
| JP | 2000-151083 | 5/2000 |
| JP | 2002-334954 | 11/2002 |

(Continued)

OTHER PUBLICATIONS

International Search Report issued in International Patent Application No. PCT/JP2010/004590 dated Aug. 24, 2010.

*Primary Examiner* — Jenny L Wagner
*Assistant Examiner* — Ahmad D Barnes
(74) *Attorney, Agent, or Firm* — McDermott Will & Emery LLP

(57) ABSTRACT

An electronic module 10 includes: a circuit board 12 having a first surface and a second surface opposite the first surface; and a plurality of electronic components 14 mounted thereon. The electronic components 14 are sealed at the first surface of the circuit board 12, with a mold body 16 composed of a resin composition. A shield layer 28 is formed on the surface of the mold body 16. The glass transition temperature of a resin included in the mold body 16 is higher than the glass transition temperatures of resins included in the circuit board 12 and the shield layer 28, respectively. The modulus of elasticity of the mold body at 25° C. is 10 to 18 GPa, and the thickness of the circuit board is 0.3 to 1.0 mm.

5 Claims, 3 Drawing Sheets

(51) Int. Cl.
  *H01L 23/31* (2006.01)
  *H01L 23/552* (2006.01)
  *H01L 25/16* (2006.01)
  *H05K 1/02* (2006.01)
  *H05K 1/03* (2006.01)

(52) U.S. Cl.
  CPC ......... *H01L 23/3121* (2013.01); *H01L 23/552* (2013.01); *H01L 25/165* (2013.01); *H01L 2224/16225* (2013.01); *H01L 2924/3025* (2013.01); *H05K 1/0218* (2013.01); *H05K 1/0313* (2013.01); *H05K 2203/1316* (2013.01); *H01L 2924/01019* (2013.01)

(56) References Cited

U.S. PATENT DOCUMENTS

| | | | |
|---|---|---|---|
| 2006/0272150 A1* | 12/2006 | Eguchi et al. | 29/841 |
| 2010/0020497 A1* | 1/2010 | Hayakawa et al. | 361/705 |
| 2010/0020518 A1* | 1/2010 | Bustamante | 361/818 |

FOREIGN PATENT DOCUMENTS

| | | |
|---|---|---|
| JP | 2004-103998 | 4/2004 |
| JP | 2005-183430 | 7/2005 |
| JP | 2008-258478 | 10/2008 |
| WO | WO 2005/004563 A1 | 1/2005 |

* cited by examiner

ELECTRONIC MODULE AND PRODUCTION METHOD THEREFOR

RELATED APPLICATIONS

This application is the U.S. National Phase under 35 U.S.C. §371 of International Application No. PCT/JP2010/004590, filed on Jul. 15, 2010, which in turn claims the benefit of Japanese Application No. 2009-168625, filed on Jul. 17, 2009, the disclosures of which Applications are incorporated by reference herein.

TECHNICAL FIELD

The present invention relates to an electronic module, and particularly relates to an electronic module including a circuit board and at least one electronic component, in which the electronic component mounted on the circuit board is sealed with a resin composition.

BACKGROUND ART

Other than instances where electronic components are each handled as independent components, there are also many instances where a module, in which at least one electronic component is mounted on a circuit board so as to perform a specific function, is handled as one component. In such an electronic module, there are also many instances where the electronic component mounted on the circuit board is entirely sealed with a resin composition, so as to protect the electronic component and to reinforce bonding between the circuit board and the electronic component.

Such a resin composition mainly includes a thermosetting resin such as an epoxy resin or a phenol resin, and is, in a molten state, supplied around the electronic component and into gaps between the electronic component and the circuit board, followed by curing. This causes formation of a solid matter (hereinafter referred to as mold body) which encompasses the electronic component.

The reason why a resin composition including an epoxy resin or a phenol resin is used for formation of the mold body, is because such a resin composition has low viscosity when in a molten state, and can therefore be easily supplied in sufficient amounts into gaps between the electronic component and the circuit board. However, the mold body formed from such a resin composition has a low modulus of elasticity, and there are instances where bonding between the electronic component and the circuit board cannot be reinforced with sufficient strength, against impacts due to drops or the like.

Therefore, a proposal has been made for a reinforcement structure for an electronic module, by which sufficient reinforcement strength can be obtained by disposing a reinforcement frame around an electronic component mounted on a circuit board, and then filling a resin composition into the frame to form a mold body (c.f., PTL 1).

CITATION LIST

Patent Literature

[PTL 1] Japanese Laid-Open Patent Publication No. 2000-151083

SUMMARY OF INVENTION

Technical Problem

However, by the above-described reinforcement structure, the presence of the frame causes extreme difficulty in reducing the thickness of the electronic module; and also causes reduction in the area for mounting the electronic component, the reduction being in proportion to the space necessary for attaching the frame.

Thus, under the present circumstances where thickness reduction and high-density mounting are required of electronic modules, there is a demand for reinforced bonding between the circuit board and the electronic component with sufficient strength, without the use of the above-described reinforcement frame.

To realize such a demand, it would be necessary to form a mold body with a higher modulus of elasticity. By increasing the modulus of elasticity of the mold body as well as the rigidity thereof, bonding between the circuit board and the electronic component would be reinforced effectively, thereby increasing impact resistance of the electronic module.

However, even if the modulus of elasticity of the mold body is increased to improve impact resistance of the electronic module, warpage of the electronic module would become more of a problem, as the electronic module becomes more reduced in thickness.

The following is to describe this point in detail. To increase the modulus of elasticity of the mold body, a much larger amount of filler would be required in the resin composition which would serve as the material for the mold body. However, if a large amount of filler is included in the resin composition, the mold body formed from this material would tend to become brittle. To prevent the mold body from becoming brittle, it would be necessary to use in a resin composition, a resin with a high glass transition temperature. However, if such a resin composition is used, and the circuit board is of a typical kind made with resin, there would be instances where the resin included in the circuit board would be heated to the extent of exceeding its glass transition temperature.

In such instances, the circuit board would still be in a rubber state, at the point where the electronic module is cooled from high temperature and the mold body is transformed into a glass state. When the circuit board is subsequently cooled and is transformed into a glass state, and if it contracts at that time, then, warping of the electronic module would occur.

If the electronic module becomes warped, then, at the time of mounting the electronic module on the motherboard or the like (second mounting), there would be lack of stability in the bonding conditions between the electrodes disposed on the lower surface of the circuit board and the electrodes on the motherboard, depending on the positions of the electrodes, thereby easily causing poor bonding. As a result, there would be an adverse effect on the reliability of the mounting of the electronic module.

Moreover, at the time of the second mounting, the electronic module would be heated, thereby resulting in reduced warping. If the electronic module is warped to a great extent, gaps would be easily created on the bonding interface between the mold body and the circuit board when warping is reduced. With such gaps created, if solder which bonds the electronic component and the circuit board melts due to heating during the second mounting, there would be an occurrence of a phenomenon (i.e., solder flushing) by which the molten solder seeps into the above-mentioned gaps.

Therefore, the present invention aims to provide an electronic module with high impact resistance and of which warpage is suppressed regardless of including therein a thin circuit board having a thickness of 0.3 to 1.0 mm.

Means for Solving the Problem

One aspect of the present invention is an electronic module comprising:

a circuit board including a first resin and having a first surface and a second surface opposite the first surface;

at least one electronic component being disposed on the first surface of the circuit board; and a mold body including a second resin, for sealing the electronic component at the first surface of the circuit board, wherein the electronic module further comprises a shield layer including a third resin and being disposed on a surface of the mold body, the modulus of elasticity of the mold body at 25° C. is 10 to 18 GPa, the thickness of the circuit board is 0.3 to 1.0 mm, and the second resin has a higher glass transition temperature than the first resin and the third resin.

Another aspect of the present invention is a production method for an electronic module, the method comprising:

(a) preparing a circuit board and an electronic component, the circuit board including a first resin and having a first surface and a second surface opposite the first surface, with at least the first surface having electrodes formed thereon, and the electronic component having terminals corresponding to the electrodes;

(b) bonding the electrodes and the terminals together with a bonding material;

(c) sealing the electronic component at the first surface of the circuit board, with a mold body including a second resin which has a higher glass transition temperature than the first resin; and (d) forming on a surface of the mold body, a shield layer including a third resin which has a lower glass transition temperature than the second resin.

Advantageous Effects of Invention

According to the present invention, an electronic module with high impact resistance and of which warping is suppressed regardless of including therein a thin circuit board having a thickness of 0.3 to 1.0 mm, can be provided.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

Figure 1:
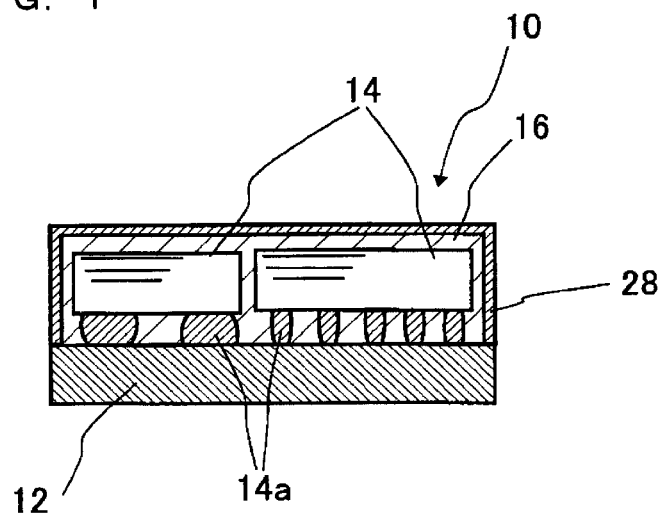
FIG. 1 is a sectional view schematically showing an electronic module according to an embodiment of the present invention.

An electronic module of the present invention comprises: a circuit board including a first resin and having a first surface and a second surface opposite the first surface; at least one electronic component disposed on the first surface of the circuit board; and a mold body including a second resin, for sealing the electronic component at the first surface of the circuit board. Further, the electronic module of the present invention comprises a shield layer including a third resin and being disposed on the surface of the mold body. Also, in the electronic module of the present invention, the modulus of elasticity of the mold body at 25° C. is 10 to 18 GPa, the thickness of the circuit board is 0.3 to 1.0 mm, and the second resin has a higher glass transition temperature than the first resin and the third resin.

By sealing the electronic module with the mold body having great rigidity, due to the modulus of elasticity thereof at 25° C. being 10 GPa or more, bonding between the electronic component and the circuit board can be reinforced with sufficient strength. On the other hand, by making the modulus of elasticity thereof 18 GPa or less, gaps are prevented from being easily created between the electronic component and the mold body as well as between the circuit board and the mold body, due to the mold body being too rigid and thus brittle. Thus, an electronic module having high impact resistance can be obtained.

As such, to form the mold body having great rigidity for improved impact resistance of the electronic module, it would be necessary to form the mold body with use of a resin composition which includes a resin having a high glass transition temperature. As a result, the glass transition temperature of the second resin included in the mold body is higher than the glass transition temperature of the first resin included in the circuit board, and the greater the difference therebetween, the easier it becomes for a warp (convex warp on the first surface side) to be developed on the circuit board. This warp is particularly significant in the electronic module including the circuit board which is thin due to having a thickness of 0.3 to 1.0 mm.

Therefore, the intention of the present invention is to reduce warping of the electronic module, by forming on the surface of the mold body, the shield layer which includes the third resin. That is, if the material for the shield layer is supplied onto the surface of the mold body and then cured, the shield layer would contract. This would eliminate the convex warp on the first surface side of the circuit board. Therefore, it would be possible to reduce warping of the circuit board or of the electronic module.

Herein, the glass transition temperature of the second resin included in the mold body is preferably 150 to 250° C. The glass transition temperature of the first resin included in the circuit board is preferably 130 to 150° C.

In addition, the difference between the glass transition temperature of the second resin and that of the first resin is preferably 5 to 40° C. By making the difference therebetween 40° C. or less, warping of the circuit board can be better suppressed. On the other hand, by making the difference therebetween 5° C. or more, the circuit board can be prevented from becoming warped in the opposite direction due to contraction of the shield layer.

The glass transition point of the resin included in the shield layer is preferably 25 to 30° C.

Corresponding to the above, a production method for the electronic module of the present invention comprises the steps of: (a) preparing a circuit board and an electronic component, the circuit board including a first resin and having a first surface and a second surface opposite the first surface, with at least the first surface having electrodes formed thereon, and the electronic component having terminals disposed at positions corresponding to the electrodes; (b) bonding the electrodes and the terminals together with a bonding material; (c) sealing the electronic component at the first surface of the circuit board, with a mold body including a second resin which has a higher glass transition temperature than the first resin; and (d) forming on the surface of the mold body, a shield layer including a third resin which has a lower glass transition temperature than the second resin.

Herein, the effect of the present invention becomes more remarkable, in the case where the steps (a) to (d) are carried out on the circuit board or on a circuit board precursor comprising a plurality of the circuit boards, of which the area of the upper surface is 80 to 250 cm². Also, the effect of the present invention becomes more remarkable, in the case where the first and second resins are heated up to 130 to 150° C. at the step (c), or in the case where the first, second, and third resins are heated up to 90 to 110° C. at the step (d).

Hereinafter, embodiments of the present invention will be described with reference to drawings.

Embodiment 1

In FIG. 1, a schematic configuration of an electronic module according to Embodiment 1 of the present invention is shown in sectional view.

The electronic module 10 shown in the drawing comprises: a circuit board 12 including a resin (first resin) and being, for example, a printed wiring board; a predetermined number (two in the case of the drawing) of electronic components mounted on an upper surface (first surface) of the circuit board 12; a mold body 16 including a resin (second resin), for sealing the electronic components at the upper surface of the circuit board 12; and a shield layer 28 including a resin (third resin) and being formed on a surface of the mold body 16, in a manner such that it encompasses the mold body 16.

The thickness of the circuit board 12 can be 0.3 to 1.0 mm, and the thickness of the mold body 16 can be 0.7 to 1.0 mm. In the above case, the height of the electronic component 14 (height beginning from the upper surface of the circuit board 12, when it is mounted on the circuit board 12) is 0.3 to 0.6 mm.

The respective lower surfaces of the electronic components 14 are provided with a plurality of bumps 14a, serving as electrode terminals. By bonding these bumps 14a to the electrodes (not shown), which correspond to these bumps 14a and are provided on the upper surface of the circuit board 12, the electronic components 14 are mounted on the circuit board 12.

The circuit board 12 preferably includes the first resin such as an epoxy resin, a phenol resin, or a polyimide resin. The glass transition temperature of the first resin is preferably 130 to 150° C. The coefficient of linear expansion (α2) of the circuit board 12 at 250° C. is preferably 20 to 100 ppm/° C.

The modulus of elasticity (modulus of elasticity in bending) of the circuit board 12 at room temperature (25° C.) is preferably lower than that of the mold body 16 at room temperature, and the difference therebetween is preferably 1 to 5 GPa. Also, the modulus of elasticity of the circuit board 12 at room temperature is preferably 9 to 17 GPa.

The mold body 16 is formed with use of a resin composition including the second resin which is a thermosetting resin such as an epoxy resin or a phenol resin, and a predetermined amount of a filler. The resin composition as such, is, in a molten state, supplied around the electronic component 14 and into gaps between the electronic component 14 and the circuit board 12, by a method such as vacuum printing. Thereafter, the resin composition supplied is heated to a predetermined temperature, cured, and then cooled, thereby forming a mold body 16.

With respect to the mold body 16, the modulus of elasticity (modulus of elasticity in bending) at room temperature is preferably 10 to 18 GPa. If the modulus of elasticity is less than 10 GPa, rigidity of the mold body would become too small, and it would not be possible to reinforce bonding of the electronic component to the circuit board 12 with sufficient strength. As a result, impact resistance of the electronic module 10 would be reduced. On the other hand, if the modulus of elasticity exceeds 18 GPa, rigidity of the mold body 16 would become too great, and the mold body 16 would become brittle.

The glass transition temperature of the second resin included in the mold body 16 is preferably 150 to 250° C. Further, with respect to the mold body 16, the coefficient of linear expansion is preferably 50 ppm/° C. or less, when the mold body 16 is heated to a temperature (e.g., 250° C.) which is equal to or higher than the glass transition temperature of the second resin included therein, and is, at the same time, lower than the melting point or decomposition point thereof. If the above-mentioned coefficient of linear expansion exceeds 50 ppm/° C., there would be a significant change in volume at the time of transformation from a rubber state to a glass state. Also, in the above case, the circuit board 12 would become convexly warped on a lower surface side (second surface side) thereof, and formation of the shield layer 28 would cause the warp to become greater.

On the other hand, if the glass transition temperature exceeds 250° C., there would be a significant difference between the glass transition temperature of the second resin included in the mold body 16 and the glass transition temperature of the first resin (e.g., 140° C.) included in the circuit board 12. Due to the above, there would be increase in the volume of the circuit board 12 where deformed, beginning from when the mold body 16 is cured and transformed into glass, until when the circuit board 12 is transformed into glass, and this would cause the warp of the electronic module to become greater. In this regard, it is preferable that the difference between the glass transition temperature of the first resin included in the circuit board 12 and the glass transition temperature of the second resin included in the mold body 16, is 5 to 40° C. A more preferred glass transition temperature of the second resin included in the mold body 16, is 150 to 200° C.

With respect to the resin composition, it is preferable that the viscosity (viscosity measured using a single-cylinder rotational viscometer, with its 14 mm-radius rotor being set to rotate at 5 rpm) at room temperature before curing is 70 to 250 Pa·s, and that the thixotropic ratio (thixotropic ratio of 0.5 rpm/5 rpm, according to a E-type viscometer) at 25° C. before curing is 1.5 to 2.0. If the viscosity is less than 70 Pa·s, the form of the resin composition, which is supplied around the electronic component 14 by a method such as printing, would not be stable. Thus, the mold body 16, which is formed by curing this resin composition, would not be formed in its intended form. The same applies to instances where the thixotropic ratio is less than 1.5. In such instances, it would not be possible to effectively reinforce bonding of the electronic component 14 to the circuit board 12.

On the other hand, if the viscosity of the resin composition exceeds 250 Pa·s, there would be difficulty in filling the resin composition into the gaps between the electronic component 14 and the circuit board 12, thus becoming a cause for solder flushing to occur. Also, it would not be possible to effectively reinforce bonding between the electronic component 14 and the circuit board 12. The same applies to instances where the thixotropic ratio exceeds 2.0.

A further preferred viscosity of the resin composition at room temperature before curing, is 100 to 200 Pa·s, and a further preferred thixotropic ratio thereof at room temperature before curing, is 1.7 to 1.8.

In addition, the mean particle size of the filler included in the resin composition is preferably 0.5 μm or more and 20 μm or less. If the mean particle size of the filler exceeds 20 μm, there are instances where the filler does not go into the gaps between the electronic component 14 and the circuit board 12, thus becoming a cause for voids to be created. Further, the proportion of the resin relative to the entire resin composition becomes relatively large, thus significantly impairing the effect of reinforcement. The volume-based, mean particle size of the filler is preferably 18 μm or less. Also, for the mold body 16 to have the modulus of elasticity in the above-mentioned range, it is preferable that the filler content in the resin composition is 80 to 85 wt %.

The shield layer 28 is preferably formed from a mixture comprising the third resin and a filler of a conductive material. The third resin is preferably an epoxy resin or the like. The coefficient of linear expansion ($\alpha 2$) of the shield layer 28 at 250° C. is preferably 35 to 40 ppm/° C. The modulus of elasticity at room temperature is preferably 3 to 7 GPa.

The glass transition temperature of the resin included in the shield layer 28, is preferably 25 to 30° C. The viscosity of the material for the shield layer 28 at room temperature before curing, is preferably 15 to 25 Pa·s.

The conductive material is preferably fine particles of silver, copper, or the like. The mean particle size thereof is preferably 10 to 20 μm. Silver is the most preferred in particular, considering its cost, high resistance to rust, and conductivity. It is preferable that the conductive material content relative to the entire material for the shield layer 28, is 70 to 80 wt %.

By forming the above shield layer 28 in a manner such that its lower end portions contact the upper surface of the circuit board 12, electrical conduction becomes possible between the shield layer 28 and the electrodes which correspond to the bumps 14a and are provided on the upper surface of the circuit board 12. Due to the above, heat, which is released by the electronic component 14, can be transferred from the shield layer 28 to the circuit board 12, and further to the motherboard or the like on which the electronic module 10 is mounted. Therefore, it is possible to improve the ability of the electronic module 10, in terms of releasing heat.

Next, a description will be given on a production process of the electronic module of FIG. 1, with reference to FIGS. 2 to 5.

First, the electronic components 14, which constitute a plurality of the electronic modules 10, are mounted on a circuit board precursor 30. The circuit board precursor 30 comprises a plurality of the circuit boards 12 which are for the electronic module 10. An electronic component group 32, which is a group of the electronic components 14 corresponding to the one electronic module 10, is mounted on an area which corresponds to the one circuit board 12 in the circuit board precursor 30.

Provided at the peripheral portion of the circuit board precursor 30, is a margin portion 30a for fixation which will be cut and separated later. Provided at the inner border of the margin portion 30a and with predetermined spacing, are through-holes 30b which would facilitate the cutting and separating of the margin portion 30a.

Figure 2:
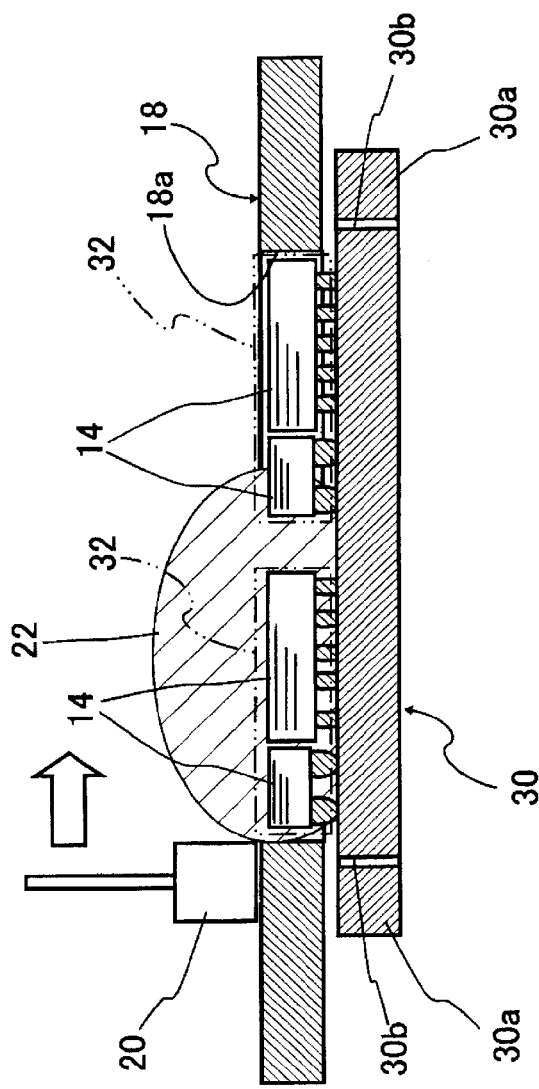
FIG. 2 is a sectional view schematically showing a production device for producing the electronic module of FIG. 1, and the electronic module in a first production process thereof.

Next, the circuit board precursor 30 on which the electronic components 14 are mounted, is placed inside a vacuum chamber (not shown). Then, as shown in FIG. 2, a mask 18 having a hole 18a open at the area intended for formation of the mold body 16, is placed in a manner such that it is covered over the circuit board precursor 30.

Then, pressure is reduced in the vacuum chamber, so that its degree of vacuum (atmospheric pressure) becomes 400 Pa or less. This enables the resin composition 22 having a high viscosity, as described above, to be sufficiently filled into gaps between the electronic components 14 and the circuit board 12. A more preferred degree of vacuum of the vacuum chamber is 100 Pa or less.

Then, while the resin composition 22 in a molten state is supplied from above the mask 18, a squeegee 20 is moved in the direction of arrow shown in the drawing. At this time, the speed at which the squeegee is moved is preferably 3 to 10 mm/s. Also, the squeegee pressure (printing pressure) is preferably 0.2 MPa or more. The height of the mask 18, which extends upward toward the upper surface thereof, that is, the print height, is preferably set about 0.1 mm above the upper surface of the electronic component 14.

It is preferable that the circuit board precursor 30, on which the electronic components 14 are mounted, is washed before the mold body 16 is formed. Washing is preferably carried out by plasma cleaning, with use of Ar (argon) or O2 (oxygen). This enables improved adhesion between the mold body 16 and the circuit board 12. As a result, filling properties of the mold body 16 improves, and reinforcement strength through bonding increases. Also, solder flushing can be better suppressed.

Figure 3:
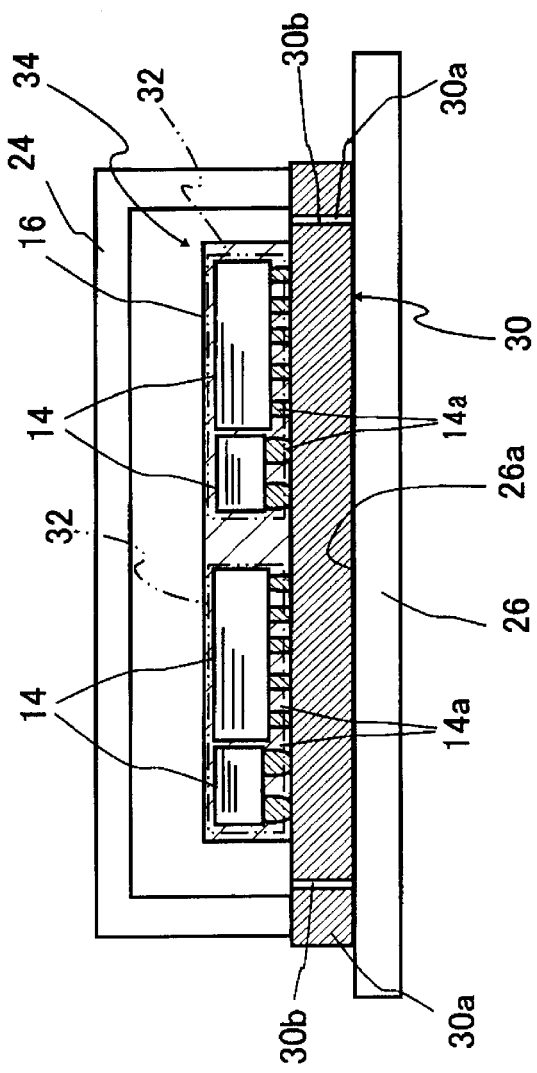
FIG. 3 is a sectional view schematically showing the electronic module in a second production process.

Next, as shown in FIG. 3, with the circuit board precursor 30 placed on a reference surface 26a of a lower jig 26, the margin portion 30a is fixed in a manner such that it is pushed from above by an upper jig 24. In this state, the resin composition 22 is heated to a predetermined temperature, cured, and then cooled, thereby forming a mold body 16. By the above, a stacked body (hereinafter referred to as intermediate stacked body) 34 comprising the circuit board precursor 30, the electronic components 14, and the mold body 16 can be obtained.

As such, by forming the mold body 16 while the circuit board 12 is fixed with the upper jig 24 and the lower jig 26, it becomes possible for the warp of the intermediate stacked body to be suppressed to a certain extent.

Figure 4:
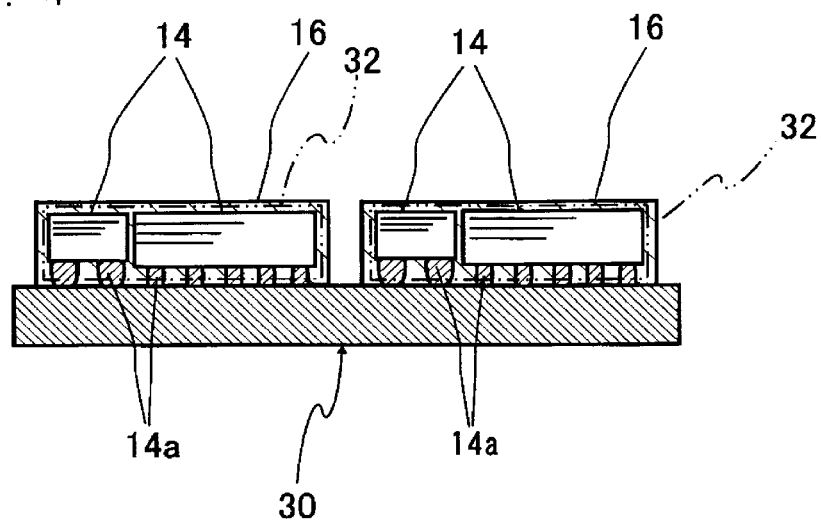
FIG. 4 is a sectional view schematically showing the electronic module in a third production process.

After the resin composition is cured and returned to room temperature, restriction to the intermediate stacked body 34 due to the upper jig 24 and the lower jig 26, is removed. Then, as shown in FIG. 4, dicing is carried out so as to remove excess part of the mold body 16 between the electronic component groups 32. Also, the margin portion 30a is cut and separated from the circuit board precursor 30.

Figure 5:
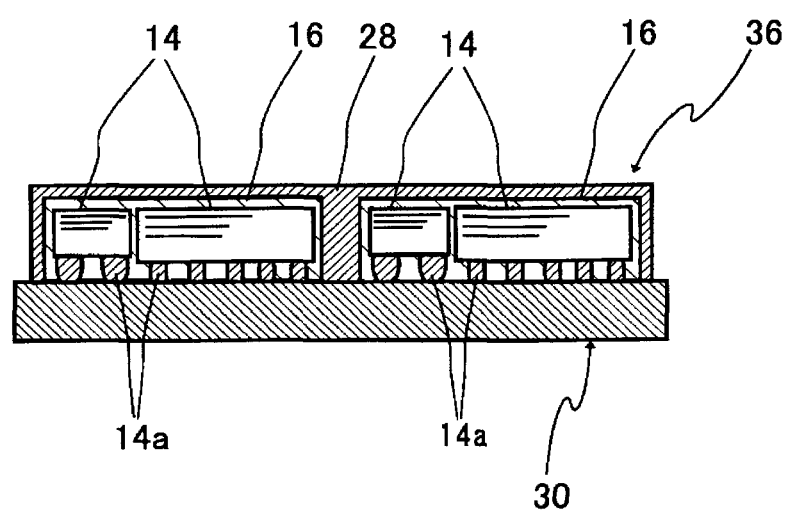
FIG. 5 is a sectional view schematically showing the electronic module in a fourth production process.

Then, the mask 18 and the squeegee 20 as shown in FIG. 2 are used again, to supply the material for the shield layer in a manner such that it encompasses each of the resultant mold bodies 16. By heating the supplied material to a predetermined temperature and then curing and cooling the same, as shown in FIG. 5, the shield layer 28, of which the thickness on the upper side of the mold body 16 is 0.08 to 0.1 mm, is formed, thereby forming an electronic module precursor 36.

Further, by cutting the electronic module precursor 36 so that the mold bodies 16 are separated from one another, and then carrying out dicing so as to adjust their shapes, the electronic module 10 shown in FIG. 1 is completed.

Next, description will be given on examples of the present invention. Note that the present invention is not limited to these examples.

Example 1

For a resin composition for forming a mold body, XV5788PA5 (product name) available from Panasonic Electric Works Co., Ltd. was used. XV5788PA5 is a mixture comprising 15 wt % of an epoxy resin and 85 wt % of spherical silica which serves as a filler. As shown in Table 1, the glass transition temperature of a second resin included in the resin composition was 180° C. The viscosity and thixotropic ratio of the resin composition at room temperature before curing, were 200 Pa·s and 1.8, respectively. The mean particle size of the spherical silica was 17 μm. Also, with respect to the mold body 16 formed with use of this resin composition, the modulus of elasticity at room temperature was 18 GPa, and the coefficient of linear expansion ($\alpha 2$) at 250° C. was 45 ppm/° C.

For a circuit board, an ALIVH® (registered trademark of Panasonic Corporation) printed circuit board was used. As shown in Table 2, with respect to a circuit board precursor, the thickness was 0.6 mm, the modulus of elasticity was 14 GPa, and the glass transition temperature of a first resin included therein was 150° C. Also, the size of the part of this circuit board precursor, excluding a margin portion therefrom, was 86.1×101.5 mm. Therefore, from this circuit board precursor, 49 (=7×7) circuit boards each having a size of 12.3×14.5 mm were able to be cut out.

For a material for a shield layer, DBC765S (product name) available from Panasonic Electric Works Co., Ltd. was used. DBC765S is a mixture comprising 15 wt % of an epoxy resin and 85 wt % of fine silver particles which serves as a filler. As shown in Table 3, with respect to this material, the viscosity at room temperature before curing was 19 Pa·s, and the glass transition temperature of a third resin included therein was 30° C. Also, the coefficient of linear expansion ($\alpha 2$) at 250° C. of the shield layer made from this material, was 40 ppm/° C.

To mount onto the circuit board five electronic components, one being a power transistor, a total of 78 solder bumps provided on the respective lower surfaces of the electronic components, were bonded to electrodes provided on the upper surface of the circuit board.

Next, with use of a device shown in FIG. 2, the resin composition was supplied to the upper surface of the circuit board precursor by vacuum printing. At this time, the degree of vacuum (atmospheric pressure in chamber) for vacuum printing was 130 Pa, the squeegee speed was 5 mm/s, and the squeegee pressure was 0.4 MPa.

Next, the circuit board precursor, to which the resin composition was supplied, was heated for 30 minutes inside a resin curing furnace in which the temperature was 150° C., with the circuit board precursor being placed on the upper surface of a lower jig and being fixed thereon with an upper jig. Thereafter, by cooling until reaching room temperature with use of a cooling device, an intermediate stacked layer body having the mold body formed therein, was obtained.

After dicing the mold body in the intermediate stacked layer as shown in FIG. 4, the material for the shield layer was supplied with use of the device shown in FIG. 2 by vacuum printing, in a manner such that the material encompassed each of the resultant mold bodies, beginning from the upper surface of the circuit board precursor. For printing conditions, the degree of vacuum (atmospheric pressure in chamber) was 130 Pa, the squeegee speed was 2 mm/s, and the squeegee pressure was 0.1 MPa.

Next, the intermediate stacked body, to which the material for the shield layer was supplied, was heated for ten minutes inside a resin curing furnace in which the temperature was 100° C., with the intermediate stacked body being placed on the upper surface of a lower jig and being fixed thereon with an upper jig. Thereafter, by cooling the intermediate stacked body to 30° C. with use of a cooling device, an electronic module precursor having the shield layer formed therein, was obtained.

Example 2

For a resin composition, XV5423RF (product name) available from Panasonic Electric Works Co., Ltd. was used. XV5423RF is a mixture comprising 20 wt % of an epoxy resin and 80 wt % of spherical silica which serves as a filler. As shown in Table 1, the mean particle size of the filler was 17 μm, and the viscosity and thixotropic ratio of the resin composition at room temperature were 70 Pa·s and 2.0, respectively. The glass transition temperature of a second resin included in this resin composition was 155° C.

The temperature inside the resin curing furnace for curing the resin composition, was 150° C. The heating time was 30 minutes. With respect to a mold body thus formed, the modulus of elasticity at room temperature was 12 GPa, and the coefficient of linear expansion ($\alpha 2$) at 250° C. was 50 ppm/° C.

The glass transition temperature of a resin included in a shield layer, was 25° C. The viscosity of a material for the shield layer at room temperature before curing, was 20 Pa·s. The coefficient of linear expansion ($\alpha 2$) at 250° C. was 110 ppm/° C. The modulus of elasticity of the shield layer at room temperature, was 3 GPa. The temperature inside the resin curing furnace for curing the material for the shield layer, was 90° C. The heating time was 20 minutes.

Except for the above, an electronic module precursor was produced in the same manner as Example 1.

Example 3

For a resin composition, a mixture comprising 15 wt % of an epoxy resin and 85 wt % of spherical alumina which served as a filler, was used. As shown in Table 1, the mean particle size of the filler was 19 μm, and the viscosity and thixotropic ratio of the resin composition at room temperature were 240 Pa·s and 1.7, respectively. The glass transition temperature of a resin included in this resin composition, was 160° C.

The temperature inside the resin curing furnace for curing the resin composition, was 150° C. The heating time was 30 minutes. With respect to a mold body thus formed, the modulus of elasticity was 14 GPa, and the coefficient of linear expansion ($\alpha 2$) at 250° C. was 48 ppm. Except for the above, an electronic module precursor was produced in the same manner as Example 1.

Comparative Example 1

For a resin composition, a mixture comprising 35 wt % of an epoxy resin and 65 wt % of spherical silica which served as a filler, was used. As shown in Table 1, the mean particle size of the filler was 19 μm, and the viscosity and thixotropic ratio of the resin composition at room temperature were 55 Pa·s and 1.4, respectively. The glass transition temperature of a resin included in this resin composition was 80° C.

The temperature inside the resin curing furnace for curing the resin composition, was 120° C. The heating time was 60 minutes. With respect to a mold body thus formed, the modulus of elasticity at room temperature was 5 GPa, and the coefficient of linear expansion ($\alpha 2$) at 250° C. was 65 ppm/° C. Except for the above, an electronic module precursor was produced in the same manner as Example 1.

Comparative Example 2

For a resin composition, a mixture comprising 30 wt % of an epoxy resin and 70 wt % of spherical silica which served as a filler, was used. As shown in Table 1, the mean particle size of the filler was 19 μm, and the viscosity and thixotropic ratio of the resin composition at room temperature were 65 Pa·s and 1.3, respectively. The glass transition temperature of a resin included in this resin composition was 110° C.

The temperature of the resin curing furnace for curing the resin composition, was 120° C. The heating time was 60 minutes. With respect to a mold body thus formed, the modulus of elasticity at room temperature was 8 GPa, and the coefficient of linear expansion (α2) at 250° C. was 60 ppm/° C. Except for the above, an electronic module precursor was produced in the same manner as Example 1.

Comparative Example 3

For a resin composition, a mixture comprising 33 wt % of an epoxy resin and 67 wt % of spherical silica which served as a filler, was used. As shown in Table 1, the mean particle size of the filler was 19 μm, and the viscosity and thixotropic ratio of the resin composition at room temperature were 60 Pa·s and 1, respectively. The glass transition temperature of a resin included in this resin composition was 115° C.

The temperature of the resin curing furnace for curing the resin composition, was 120° C. The heating time was 60 minutes. With respect to a mold body thus formed, the modulus of elasticity at room temperature was 8 GPa, and the coefficient of linear expansion (α2) at 250° C. was 62 ppm/° C. Except for the above, an electronic module precursor was produced in the same manner as Example 1.

Comparative Example 4

Except for not including a shield layer, an electronic module precursor was produced in the same manner as Example 1.

TABLE 1

| | mold body (second resin) | | | | | |
|---|---|---|---|---|---|---|
| | modulus of elasticity (GPa) | α2 (ppm/° C.) | glass transition temperature (° C.) | viscosity (Pa·s) | thixotropic ratio | mean particle size of filler (μm) | filler content (wt %) |
| Ex. 1 | 18 | 45 | 180 | 200 | 1.8 | 17 | 85 |
| Ex. 2 | 12 | 50 | 155 | 70 | 2.0 | 17 | 80 |
| Ex. 3 | 14 | 48 | 160 | 240 | 1.7 | 19 | 85 |
| Comp. Ex. 1 | 5 | 65 | 80 | 55 | 1.4 | 19 | 65 |
| Comp. Ex. 2 | 8 | 60 | 110 | 65 | 1.3 | 19 | 70 |
| Comp. Ex. 3 | 8 | 62 | 115 | 60 | 1 | 19 | 67 |
| Comp. Ex. 4 | 18 | 45 | 180 | 200 | 1.8 | 17 | 85 |

TABLE 2

| | circuit board (first resin) | | |
|---|---|---|---|
| | thickness (mm) | modulus of elasticity (GPa) | glass transition temperature (° C.) |
| Ex. 1 | 0.6 | 14 | 150 |
| Ex. 2 | 0.6 | 14 | 150 |
| Ex. 3 | 0.6 | 14 | 150 |
| Comp. Ex. 1 | 0.6 | 18 | 160 |
| Comp. Ex. 2 | 0.6 | 18 | 160 |
| Comp. Ex. 3 | 0.6 | 18 | 160 |
| Comp. Ex. 4 | 0.6 | 14 | 150 |

TABLE 3

| | shield layer (third resin) | | | |
|---|---|---|---|---|
| | modulus of elasticity (GPa) | α2 (ppm/° C.) | glass transition temperature (° C.) | viscosity (Pa·s) |
| Ex. 1 | 5 | 40 | 30 | 19 |
| Ex. 2 | 3 | 110 | 25 | 20 |
| Ex. 3 | 5 | 40 | 30 | 19 |
| Comp. Ex. 1 | 5 | 40 | 30 | 19 |
| Comp. Ex. 2 | 5 | 40 | 30 | 19 |
| Comp. Ex. 3 | 5 | 40 | 30 | 19 |
| Comp. Ex. 4 | — | — | — | — |

With respect to the electronic module precursors of Examples 1 to 3 and Comparative Examples 1 to 4, evaluations were performed in terms of presence or absence of warping of the circuit board, and of solder flushing.

With respect to warping of the circuit board precursor, the electronic module precursor was heated with use of a reflow furnace (peak temperature: 260° C.; available from Panasonic Factory Solutions Co., Ltd.), and then, the warp of the circuit board precursor caused thereby was measured with use of a flatness measuring device (core9035a (product name), available from CORES Corporation). More specifically, the difference in height between the highest point and the lowest point of the lower surface of the circuit board precursor, was designated as the warp of the circuit board. If the above difference was 120 μm or less, evaluation was "Good (G)", and if over 120 μm, "Not Good (NG)".

With respect to presence or absence of solder flushing, measurement of the distance of solder that has seeped out was performed on the electronic module precursor after it was heated in the reflow furnace, with use of an X-ray image and flat polishing, and the presence or absence was determined based on the measurement result.

More specifically, with respect to bonded areas between the electrodes of the circuit board precursor and the terminals of the electronic components, the bonding being due to the 78 points of solder, first, an observation was made with use of an X-ray image, to see if the solder was present in its original position.

Then, areas where the solder was deviated from its original position or areas where its shadow was deformed, were subjected to plane polishing, and the length of the deformation was measured. Herein, areas where the solder seeped out over 0.1 mm from the electrode, were determined as causing solder flushing. If solder flushing was present, even if at one area, that electronic module precursor was evaluated as "Not Good (NG)", and if there were no solder flushing present, "Good (G)".

The evaluation results of the above are shown in Table 4. Shown in the parentheses are the number of areas with solder flushing and the warp size of the circuit board.

TABLE 4

| | evaluation | |
|---|---|---|
| | solder flushing (number of areas) | warping of circuit board precursor (μm) |
| Ex. 1 | G (0) | G (87) |
| Ex. 2 | G (0) | G (102) |
| Ex. 3 | G (0) | G (115) |
| Comp. Ex. 1 | NG (12) | NG (143) |
| Comp. Ex. 2 | NG (26) | NG (187) |
| Comp. Ex. 3 | NG (12) | NG (130) |
| Comp. Ex. 4 | NG (11) | NG (127) |

With respect to the electronic module precursors of Examples 1 to 3, the glass transition temperature of the resin included in the mold body was higher than the glass transition temperatures of the resins included in the circuit board and the shield layer, respectively. It is considered that, as a result, the warp (convex warp in upward direction) of the electronic module precursor, which was developed when the circuit board transformed into glass after the mold body transformed into glass, was reduced by contraction caused when the shield layer transformed into glass, thereby making the warp smaller.

Therefore, it is considered that solder flushing was prevented from occurring due to gaps not being created between the mold body and the circuit board, also at the time the electronic module precursor was heated in the reflow furnace and warping thereof was reduced.

In addition, with respect to the electronic module precursors of Examples 1 to 3, it is presumed that there was sufficient reinforcement strength to reinforce bonding between the electronic components and the circuit board, against impacts caused by drops or the like, since the modulus of elasticity of the mold body at room temperature was 10 to 18 GPa.

In contrast, with respect to the electronic module precursors of Comparative Examples 1 to 3, the glass transition temperature of the resin included in the mold body was lower than the glass transition temperature of the resin included in the circuit board. It is considered that, as a result, a convex warp in a downward direction was developed in the electronic module precursor due to the mold body being transformed into glass, followed by further warping due to contraction caused when the shield layer transformed into glass, thereby making the warp greater.

It is considered that, as a result of this warp having become greater, gaps were created between the mold body and the circuit board at a number of bonding areas therebetween, thereby causing solder flushing, at the time the electronic module precursor was heated in the reflow furnace and warping thereof was reduced.

In addition, with respect to the electronic module precursors of Comparative Examples 1 to 3, it is presumed that there was not sufficient reinforcement strength to reinforce bonding between the electronic components and the circuit board, against impacts caused by drops or the like, since the modulus of elasticity of the mold body at room temperature was less than 10 GPa.

With respect to Comparative Example 4, it is presumed that the exclusion of the shield layer resulted in warping of the electronic module precursor, which was caused when the circuit board transformed into glass after the mold body transformed into glass, to be maintained without any change, thereby making the warp of the electronic module greater. It is considered that, due to the above, gaps were created between the mold body and the circuit board at a number of bonding areas therebetween, thereby causing solder flushing, at the time the electronic module precursor was heated in the reflow furnace and warping thereof was reduced.

Note that the electronic module precursor in Example 4 presumably had sufficient reinforcement strength to reinforce bonding between the electronic components and the circuit board, against impacts due to drops or the like, since the modulus of elasticity of the mold body at room temperature was in the range of 10 to 18 GPa.

INDUSTRIAL APPLICABILITY

According to the present invention, it is possible to reduce warping of an electronic module which comprises: a circuit board; at least one electronic component mounted thereon; and a mold body which seals this electronic component. Also, occurrences of solder flushing can be suppressed. Therefore, the present invention is useful as electronic modules used in portable electronic equipments which require reductions in size and weight.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

REFERENCE SIGNS LIST 10 electronic module
12 circuit board
14 electronic component
16 mold body
28 shield layer

The invention claimed is:
1. An electronic module comprising:
a circuit board including a first resin and having a first surface and a second surface opposite said first surface;
at least one electronic component being disposed on said first surface of said circuit board; and
a mold body including a second resin, for sealing said electronic component at said first surface of said circuit board,
wherein said electronic module further comprises a shield layer including a third resin and being disposed on a surface of said mold body,
the modulus of elasticity of said mold body at 25° C. is 10 to 18 GPa,
a thickness of said circuit board is 0.3 to 1.0 mm, and
said second resin has a higher glass transition temperature than said first resin and said third resin.

2. The electronic module in accordance with claim 1, wherein the glass transition temperature of said second resin is 150 to 250° C.

3. The electronic module in accordance with claim 1, wherein the glass transition temperature of said first resin is 130 to 150° C.

4. The electronic module in accordance with claim 1, wherein the difference between the glass transition temperature of said first resin and the glass transition temperature of said second resin, is 5 to 40° C.

5. The electronic module in accordance with claim 1, wherein the glass transition temperature of said third resin is 25 to 30° C.

* * * * *